(12) United States Patent
Kumath et al.

(10) Patent No.: US 11,537,114 B2
(45) Date of Patent: Dec. 27, 2022

(54) DEVICE AND METHOD FOR PRE-BOOTUP FAULT CONTROL OF A DRIVER OUTPUT

(71) Applicant: Renesas Electronics America Inc., Milpitas, CA (US)

(72) Inventors: Lokesh Kumath, Fremont, CA (US); Muthukumaran Chandrasekaran, San Jose, CA (US); Barry Concklin, San Jose, CA (US); Bin Liu, Santa Clara, CA (US); Ha Chu Vu, San Jose, CA (US); Matthew Cole, Los Altos, CA (US)

(73) Assignee: Renesas Electronics America Inc., Milpitas, CA (US)

( * ) Notice: Subject to any disclaimer, the term of this patent is extended or adjusted under 35 U.S.C. 154(b) by 0 days.

(21) Appl. No.: 17/188,908

(22) Filed: Mar. 1, 2021

(65) Prior Publication Data
US 2022/0276646 A1 Sep. 1, 2022

(51) Int. Cl.
*G05B 6/00* (2006.01)
*G06F 11/00* (2006.01)
(Continued)

(52) U.S. Cl.
CPC ...... *G05B 23/0235* (2013.01); *H01S 5/06825* (2013.01); *G05B 1/01* (2013.01);
(Continued)

(58) Field of Classification Search
CPC .............. G05B 23/0235; G05B 23/00; G05B 2219/14; G05B 2219/24; G05B 6/00; G05B 1/01; H01S 5/06825; G06F 11/00
See application file for complete search history.

(56) References Cited

U.S. PATENT DOCUMENTS

| 6,291,978 B1 * | 9/2001 | Chandler | G01R 31/2812 324/73.1 |
| 2018/0074884 A1 * | 3/2018 | Cady | G06F 11/0787 |
| 2018/0246552 A1 * | 8/2018 | Thompson | G06F 11/3093 |

FOREIGN PATENT DOCUMENTS

| CA | 2583705 C | * 12/2011 | ........... H02H 1/0092 |
| GB | 2504991 A | * 2/2014 | ......... H03K 17/9502 |

(Continued)

*Primary Examiner* — Daniel R Miller
*Assistant Examiner* — Christian T Bryant
(74) *Attorney, Agent, or Firm* — Foley & Lardner LLP

(57) ABSTRACT

Example implementations include a method of pre-bootup fault monitor of a LASER diode driver output, by applying a first power to a pre-bootup fault monitor device, setting a fault condition at the pre-bootup fault monitor device to a no-fault state, initiating the pre-bootup fault monitor device, determining whether a first impedance of driver output satisfies an impedance threshold, and in response to a determination that the first impedance satisfies the impedance threshold, applying a second power to the output device. Example implementations also include a system with a LASER output device, and a pre-bootup fault monitor device operatively coupled to the LASER output device, and operable to activate in response to receiving a first power, set a fault condition to a no-fault state, determine whether a first impedance of the output driver satisfies an impedance threshold, and, in response to a determination that the first impedance satisfies the impedance threshold, apply a second power to the LASER output device, and a power-on reset controller operatively coupled to the pre-bootup fault monitor and operable to, in response to the determination that the first impedance satisfies the impedance threshold, deactivate the pre-bootup fault monitor.

20 Claims, 6 Drawing Sheets

(51) Int. Cl.
*G05B 23/00* (2006.01)
*G05B 1/01* (2006.01)
*G05B 23/02* (2006.01)
*H01S 5/068* (2006.01)

(52) U.S. Cl.
CPC ................ *G05B 6/00* (2013.01); *G05B 23/00* (2013.01); *G05B 2219/14* (2013.01); *G05B 2219/24* (2013.01); *G06F 11/00* (2013.01)

(56) References Cited

FOREIGN PATENT DOCUMENTS

| | | | | |
|---|---|---|---|---|
| WO | WO-2008069979 A1 * | 6/2008 | ........... | H02H 1/0015 |
| WO | WO-2008069988 A2 * | 6/2008 | ............. | G01R 31/12 |
| WO | WO-2014040620 A1 * | 3/2014 | ........... | H02H 1/0015 |

* cited by examiner

DEVICE AND METHOD FOR PRE-BOOTUP FAULT CONTROL OF A DRIVER OUTPUT

TECHNICAL FIELD

The present implementations relate generally to electronic circuit drivers, and more particularly to pre-bootup fault control of driver output.

BACKGROUND

Electronic devices increasingly include output devices performing increasingly complex operation in uncontrolled environments. For example, power-on of an electronic device including a output device without a fault condition determination may result in an uncontrolled activation of the output device. Uncontrolled operation may cause eye, skin and other safety hazards, especially for high-power output devices.

SUMMARY

For safety reasons, it is advantageous that electronic systems including output devices include safety systems which monitor driver output short-circuit conditions and perform a shut off in the case of a fault condition. A short-circuit at a driver output driving the output device can be a highly dangerous fault condition because shutting down the device can be difficult or impossible unless the power supply for the device is shut down. Thus, a technological solution for pre-bootup fault of such a driver output is desired.

Example implementations include a method of pre-bootup fault control of driver output, by applying a first power to a pre-bootup fault monitor device, setting a fault condition at the pre-bootup fault controller device to a no-fault state, initiating the pre-bootup fault monitor device, determining whether a first impedance of an output driver satisfies an impedance threshold, and in response to a determination that the first impedance satisfies the impedance threshold, applying a second power to the output device.

Example implementations also include a device with a pre-bootup fault monitor device operatively coupled to the output device, and operable to activate in response to receiving a first power, set a fault condition to a no-fault state, determine whether a first impedance of the output driver satisfies an impedance threshold, and, in response to a determination that the first impedance satisfies the impedance threshold, apply a second power to the output device.

Example implementations also include a system with output device, a comparator operable to determine whether a first impedance of the output device satisfies an impedance threshold, a pre-bootup fault monitor device operatively coupled to the output device, and operable to activate in response to receiving a first power, set a fault condition to a no-fault state, determine whether a first impedance of the output driver satisfies an impedance threshold, and, in response to a determination that the first impedance satisfies the impedance threshold, apply a second power to the output device, and a power-on reset controller operatively coupled to the pre-bootup fault monitor and operable to, in response to the determination that the first impedance satisfies the impedance threshold, deactivate the pre-bootup fault monitor.

BRIEF DESCRIPTION OF THE DRAWINGS

These and other aspects and features of the present implementations will become apparent to those ordinarily skilled in the art upon review of the following description of specific implementations in conjunction with the accompanying figures, wherein.

DETAILED DESCRIPTION

Figure 1:
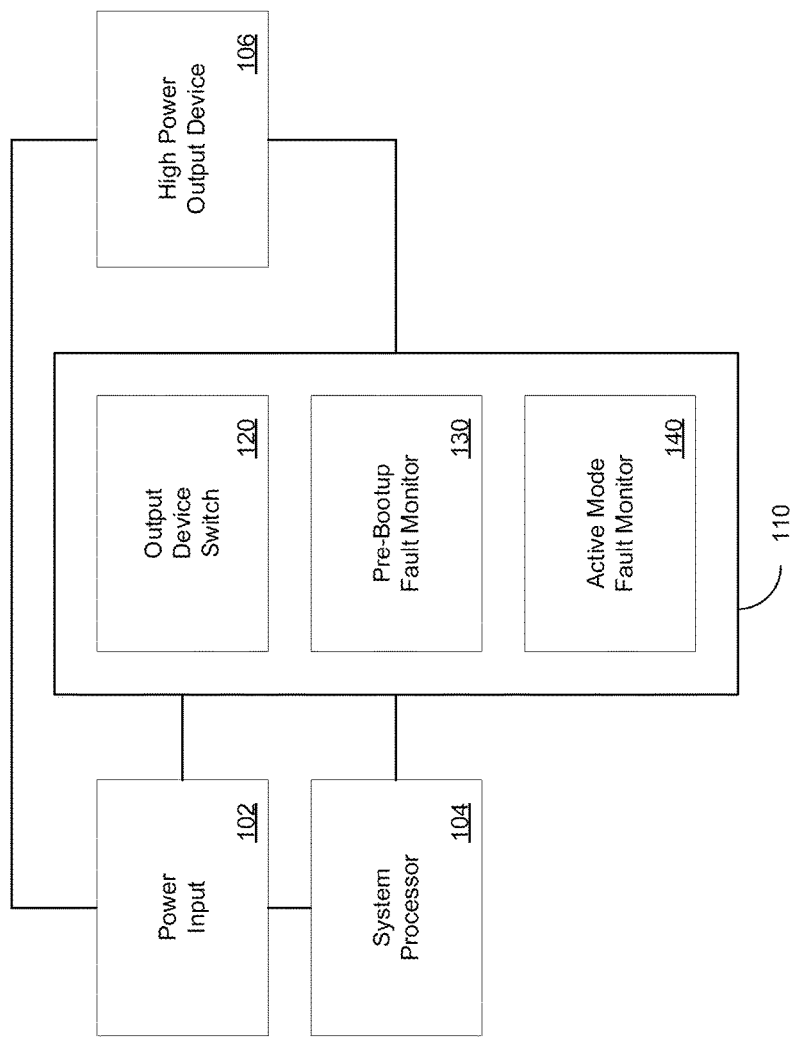
FIG. 1 illustrates an example system, in accordance with present implementations.

The present implementations will now be described in detail with reference to the drawings, which are provided as illustrative examples of the implementations so as to enable those skilled in the art to practice the implementations and alternatives apparent to those skilled in the art. Notably, the figures and examples below are not meant to limit the scope of the present implementations to a single implementation, but other implementations are possible by way of interchange of some or all of the described or illustrated elements. Moreover, where certain elements of the present implementations can be partially or fully implemented using known components, only those portions of such known components that are necessary for an understanding of the present implementations will be described, and detailed descriptions of other portions of such known components will be omitted so as not to obscure the present implementations. Implementations described as being implemented in software should not be limited thereto, but can include implementations implemented in hardware, or combinations of software and hardware, and vice-versa, as will be apparent to those skilled in the art, unless otherwise specified herein. In the present specification, an implementation showing a singular component should not be considered limiting; rather, the present disclosure is intended to encompass other implementations including a plurality of the same component, and vice-versa, unless explicitly stated otherwise herein. Moreover, applicants do not intend for any term in the specification or claims to be ascribed an uncommon or special meaning unless explicitly set forth as such. Further, the present implementations encompass present and future known equivalents to the known components referred to herein by way of illustration.

Present implementations are directed to a safety feature for output devices to prevent uncontrolled current therein. In some implementations, output devices include a LASER diode driven by a LASER Diode Drive (LDD). An LDD can be or include a low or high side current digital-to-analog converter (DAC) that drives a LASER (Light Amplification by Stimulated Emission of Radiation) diode, or a VCSEL (Vertical Cavity Surface Emitting LASER) with short and high current pulses. Pulses can be approximately a few nanoseconds, and high current can be greater than 1 A. Applications advantageously incorporating LDD devices can include Time of Flight, 3D imaging, and face recognition, among others. Example implementations can check for a short-circuit condition even before the LASER and its LDD power supply are activated, by measuring driver output impedance to check for short-circuits. In some implementations, where the short-circuit check is done before powering-up the LASER, use of a series switch is optional.

Example implementations demonstrates at least the follow advantages, including enhanced system level safety, fault detection independent of LASER resistance, improved accuracy of short-circuit detection, and reduction in cost by integration of pre-bootup fault detection devices at the chip level. A short-circuit condition at driver output can be checked before the LASER is powered-up. Further, comparing impedance at a driver output pin before applying power to a output device allows for short-circuit detection independent of the LASER/VCSEL resistance. Finally, accuracy of measurement is increased by use of a trimmable internal reference resistor.

FIG. 1 illustrates an example system, in accordance with present implementations. As illustrated by way of example in FIG. 1, an example system 100 includes a power input 102, a system processor 104, a output device 106, and an output device driver 110.

The power input 102 includes at least one source of electrical power, voltage, current, or the like for supplying power to the system 100. In some implementations, the first and second inputs 102 and 104 include, but are not limited to regulated 120 V AC power, regulated 220V AC power, 5V DC power, 12V DC power, or the like. In some implementations, the power input 102 is operable to generate one or more input power signals having independent voltage, current, or the like. In some implementations, the power input 102 is, includes, or is operatively coupled to one or more power generating devices including but not limited to a DC-DC converter or the like. In some implementations, the power input 102 includes a wired power connection, a wireless direct contact power connection, a wireless and contactless power connection, the like, or the like. In some implementations, the power input 102 includes one or more USB terminals or ports (e.g., USB-C, USB-PD).

The system processor 104 is operable to execute one or more instructions associated with input from the output device driver 110. In some implementations, the system processor 104 is an electronic processor, an integrated circuit, or the like including one or more of digital logic, analog logic, digital sensors, analog sensors, communication buses, volatile memory, nonvolatile memory, and the like. In some implementations, the system processor 104 includes but is not limited to, at least one microcontroller unit (MCU), microprocessor unit (MPU), central processing unit (CPU), graphics processing unit (GPU), physics processing unit (PPU), embedded controller (EC), or the like. In some implementations, the system processor 104 includes a memory operable to store or storing one or more instructions for operating components of the system processor 104 and operating components operably coupled to the system processor 104. In some implementations, the one or more instructions include at least one of firmware, software, hardware, operating systems, embedded operating systems, and the like. It is to be understood that the system processor 104 or the system 100 generally can include at least one communication bus controller to effect communication between the system processor 104 and the other elements of the system 100. In some implementations, the system processor 104 is operable to control activation, deactivation, and the like, of one or more power delivery outputs of the power input 102.

The output device 106 includes one or more electrical, electronic, electromechanical, electrochemical, or like devices or systems for receiving power, voltage, current, or the like from the power input to perform one or more actions. In some implementations, the output device 106 includes at least one light emitting diode (LED), high-current consuming device, laser diode, vertical-cavity surface-emitting laser (VCSEL), or the like. As one example, a high-current consuming device can include any electronic device capable of operably receiving at least 0.1 A. In some implementations, the output device 106 includes one or more devices partially or fully separable from the system 100. In some implementations, the output device 106 includes one or more devices partially or fully integrated or integrable into, or separable from, the system 100.

The output device driver 110 is operable to control, monitor, and the like the output device 106 in coordination with the system processor 104. In some implementations, the output device driver 110 includes one or more electronic, electrical, electromechanical, or like devices integrated therein, therewith, or the like. In some implementations, the output device driver 110 is operable to receive one or more power signals from the power input 102 and one or more control signals from the system processor 104. In some implementations, the output device driver 110 is operable to monitor a fault condition associated with the output device 106, or the output device driver 110, including but not limited to a short condition that can cause an overcurrent condition through the output device if powered. In some implementations, the output device driver 110 includes an output device switch 120, a pre-bootup fault monitor 130, an active mode fault monitor 140, and a current DAC 150. In some implementations, the output device driver 110 includes one or more logical or electronic devices including but not limited to integrated circuits, logic gates, flip flops, gate arrays, programmable gate arrays, and the like.

The output device switch 120 is or includes an electronic switch integrated into or with the output device driver 110. In some implementations, the output device switch 120 is operatively coupled to the power input 102 and to the output device 106, and generates a voltage drop, current drop, change in power characteristic, or the like, when closed to provide power from the power input 102 to the output device 106. In some implementations, the output device switch 120 is bypassed and the power input is operatively coupled directly to the output device 106. In some implementations, the output device switch 120 includes one or more logical or electronic devices including but not limited to integrated circuits, logic gates, flip flops, gate arrays, programmable gate arrays, and the like. It is to be understood that any electrical, electronic, or like devices, or components associated with the output device switch 120 can also be associated with, integrated with, integrable with, replaced by, supplemented by, complemented by, or the like, the output device driver 110 or any component thereof.

The pre-bootup fault monitor 130 is operable to detect a fault condition at the output device 106, or the output device driver 110 before application of supply power to the output device, and to prevent, block, or the like, application of power to the output device upon detection of a fault condition. In some implementations, the pre-bootup fault monitor 130 includes one or more logical or electronic devices including but not limited to integrated circuits, logic gates, flip flops, gate arrays, programmable gate arrays, and the like. It is to be understood that any electrical, electronic, or like devices, or components associated with the pre-bootup fault monitor 130 can also be associated with, integrated with, integrable with, replaced by, supplemented by, complemented by, or the like, the output device driver 110 or any component thereof.

The active mode fault monitor 140 is operable to detect a fault condition at the output device during application of supply power to the output device, and to prevent, block, or the like, application of power to the high output power device upon detection of a fault condition. In some implementations, the active mode fault monitor 140 includes one or more logical or electronic devices including but not limited to integrated circuits, logic gates, flip flops, gate arrays, programmable gate arrays, and the like. It is to be understood that any electrical, electronic, or like devices, or components associated with the active mode fault monitor 140 can also be associated with, integrated with, integrable with, replaced by, supplemented by, complemented by, or the like, the output device driver 110 or any component thereof.

The current DAC 150 is operable to activate the output device in response to control signals received by the system processor 104. In some implementations, the current DAC 150 is a digital-to-analog converter (DAC).

Figure 2:
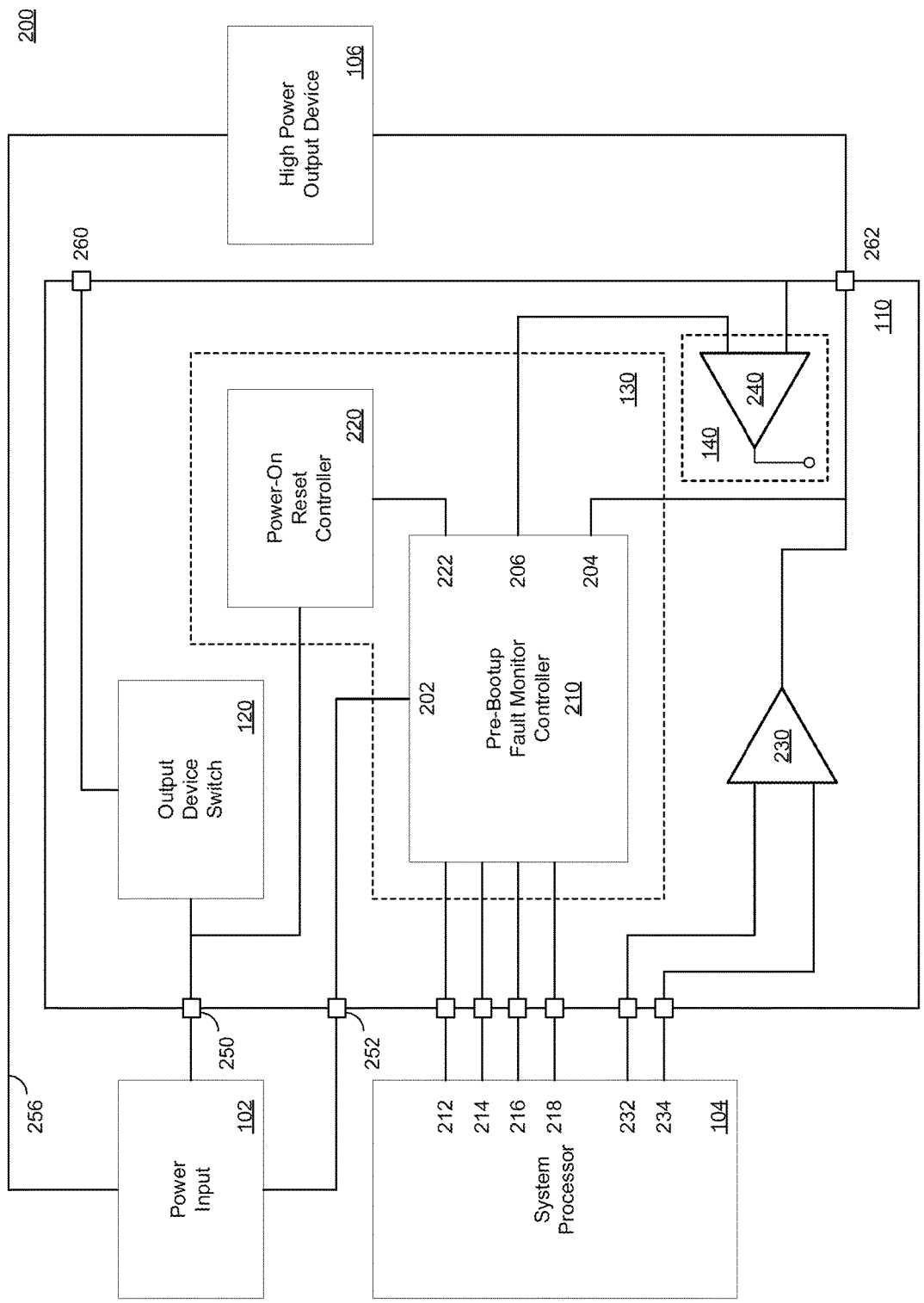
FIG. 2 illustrates an example device, in accordance with present implementations.

FIG. 2 illustrates an example device, in accordance with present implementations. As illustrated by way of example in FIG. 2, an example device 200 includes the power input 102, the system processor 104, the output device driver 110, the output device switch 120, the output device 106, the current DAC 150, a pre-bootup fault monitor controller 210, a power-on reset controller 220, and an active mode fault monitor circuit 240. In some implementations, the output device driver 110 includes a system power (VSUPP) node 250, a communication voltage (VCOMM) node 252, a serial communication enable (SEN) node 212, a serial communication clock (SCLK) node 214, a serial communication data (SDA) node 216, a fault (FLT) node 218, a first low voltage differential swing (LVDS1) node 232, a second low voltage differential swing (LVDS2) node, an output device switch (OUTSW) node 260, and an output driver (OUT) node 262. It is to be understood that one or more of the above noted nodes can be integrated circuit pins operatively couple-able to external electronic devices. In some implementations, the power input 102 is operatively coupled to the output device 106 by a connection 256. In some implementations, the connection 256 is or includes a trace, line, or the like.

The pre-bootup fault monitor controller 210 is operable to identify a fault condition by determining whether an impedance of the output device driver 110 at OUT 262 satisfies an impedance threshold indicating a no-fault condition. In some implementations, the pre-bootup fault monitor controller 210 receives input from the system processor 104 by one or more of SEN 212, SCLK 214, SDA 216. In some implementations, the pre-bootup fault monitor controller 210 transmits output to the system processor 104 by FLT 218. In some implementations, the pre-bootup fault monitor controller 210 receives power from VCOMM 252, and receives input from the power-on reset controller 220 at a fault monitor enable (FMEN) node 222. In some implementations, the pre-bootup fault monitor controller 210 receives an output impedance from OUT 262 at an output impedance node (ZOUT) 204. In some implementations, the pre-bootup fault monitor controller 210 includes one or more logical or electronic devices including but not limited to integrated circuits, logic gates, flip flops, gate arrays, programmable gate arrays, and the like. It is to be understood that any electrical, electronic, or like devices, or components associated with the pre-bootup fault monitor controller 210 can also be associated with, integrated with, integrable with, replaced by, supplemented by, complemented by, or the like, the pre-bootup fault monitor 130 or any component thereof.

The power-on reset controller 220 is operable to detect activation of VSUPP 250 and generate an output signal indicating that VSUPP 250 is activated. In some implementations, the power-on reset controller 220 is operable to transmit out to FMEN 222. In some implementations, the power-on reset controller 220 includes one or more logical or electronic devices including but not limited to integrated circuits, logic gates, flip flops, gate arrays, programmable gate arrays, and the like. It is to be understood that any electrical, electronic, or like devices, or components associated with the power-on reset controller 220 can also be associated with, integrated with, integrable with, replaced by, supplemented by, complemented by, or the like, the pre-bootup fault monitor 130 or any component thereof.

The current DAC 150 is operable to activate the output device in response to control signals received by the system processor. In some implementations, the current DAC 150 is a digital-to-analog converter (DAC) operable to receive digital control signals LVDS1 and LVDS2, and to output an analog electrical control signal to OUT 262. In some implementations, the current DAC 150 generates and supplies a voltage to OUT 262 at a particular level to induce a current drop across the output device 106 to activate the output device 106. In some implementations, the current DAC 150 includes one or more logical or electronic devices including but not limited to integrated circuits, logic gates, flip flops, gate arrays, programmable gate arrays, and the like. It is to be understood that any electrical, electronic, or like devices, or components associated with the current DAC 150 can also be associated with, integrated with, integrable with, replaced by, supplemented by, complemented by, or the like, the output device driver 110 or any component thereof.

The active mode fault monitor circuit 240 is operable correspondingly to the active mode fault monitor 140. In some implementations, the active mode fault monitor circuit 240 is or includes a comparator having a first input operatively coupled to OUT 262 and a second input 206 operatively coupled to an internal reference ZREF. In some implementations, the internal reference ZREF is a resistor or the like integrated within or associated with the output device driver 110. In some implementations, the comparator includes an output coupled to external control logic or the system processor 104, and indicates a fault condition corresponding to a fault condition detectable by the driver 110. In some implementations, the active mode fault monitor circuit 240 includes one or more logical or electronic devices including but not limited to integrated circuits, logic gates, flip flops, gate arrays, programmable gate arrays, and the like. It is to be understood that any electrical, electronic, or like devices, or components associated with the active mode fault monitor circuit 240 can also be associated with, integrated with, integrable with, replaced by, supplemented by, complemented by, or the like, the active mode fault monitor 140 or any component thereof.

Figure 3:
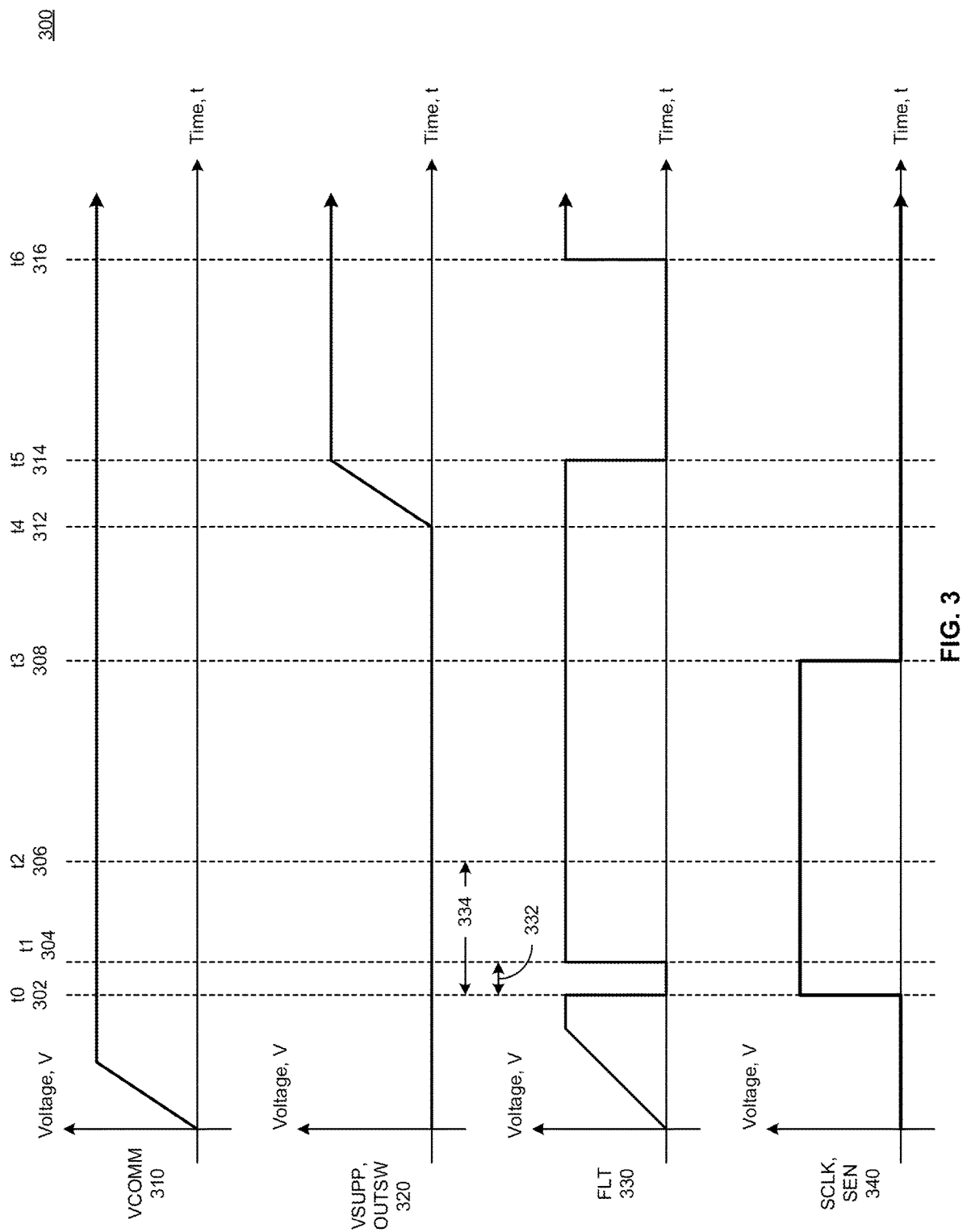
FIG. 3 illustrates an example timing diagram for pre-bootup fault control of a driver output in a no-fault state, in accordance with present implementations.

FIG. 3 illustrates an example timing diagram for pre-bootup fault monitoring of a LASER diode driver output in a no-fault state, in accordance with present implementations. As illustrated by way of example in FIG. 3, an example timing diagram 300 includes VCOMM waveform 310, VSUPP or OUTSW waveform 320, FLT waveform 330, and SCLK or SEN waveform 340. In some implementations, the low level for all signals is substantially 0 V.

Before time t0 302, a pre-bootup sequence begins by activating VCOMM 252, which rises toward the VCOMM high level. In some implementations, the VCOMM high level is 1.8 V. VSUPP and OUTSW remain at their low levels and are not activated. FLT 218 rises toward its high level and reaches its high level. In some implementations, the FLT high level is 1.8 V. SCLK 214 or SEN 212 remain at their low levels. By time t0 302, VCOMM 252 has already settled to the VCOMM high level. FLT 218 reaches its high level after a delay of at least one microsecond to one or more milliseconds. SCLK 214 or SEN 212 activates and reaches its high level, causing the pre boot-up fault monitor to activate. In some implementations, FLT 218 drops to its low level due to internal settling or the like after pre boot-up fault monitor is activated, and returns to its high level after a period 332 of at least one microsecond. In some implementations, the SCLK 214 or SEN 212 high level is 1.8 V. In some implementations, a delay period 334 of at least one microsecond begins at time t0 302.

At time t2 306, the delay period 334 ends and the pre-bootup fault monitor controller 210 or a component thereof determines that a fault condition does not exist at OUT 262 and communicates the determination to the system processor 104 through FLT 218 by keeping it at the high level. At time t3 308, the pre-bootup sequence ends and SCLK 214 or SEN 212 drops to its low level. At time t4 312, the system processor 104 begins a bootup sequence in response to the determination that no-fault condition exists, and VSUPP 260 or OUTSW 262 begin to rise to their high level. In some implementations, the VSUPP 260 or OUTSW 262 high level is 3.3 V. At time t5 314, FLT 218 drops to its low level to indicate the beginning of the bootup sequence of the output device driver 110. At time t6 316, FLT 218 returns to its high level to indicate the end of the bootup sequence of the output device driver 110.

Figure 4:
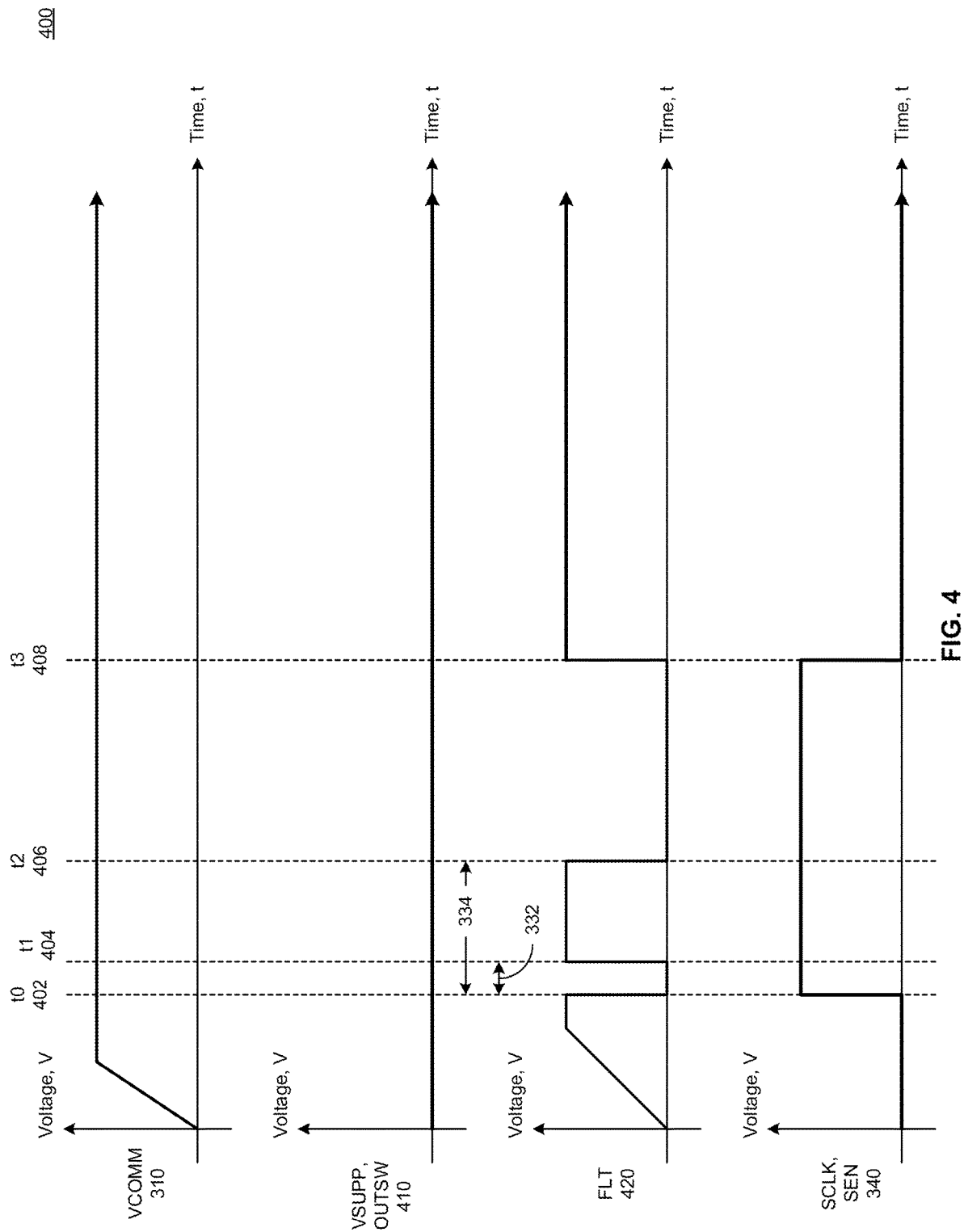
FIG. 4 illustrates an example timing diagram for pre-bootup fault control of a driver output in a fault state, in accordance with present implementations.

FIG. 4 illustrates an example timing diagram for pre-bootup fault monitoring of laser output in a fault state, in accordance with present implementations. As illustrated by way of example in FIG. 4, an example timing diagram 400 includes VCOMM waveform 310, VSUPP or OUTSW waveform 410, FLT waveform 420, and SCLK or SEN waveform 340. In some implementations, the low level for all signals is substantially 0 V.

Before time t0 402, a pre-bootup sequence begins by activating VCOMM 252, which rises toward the VCOMM high level. VSUPP and OUTSW remain at their low levels and are not activated. FLT 218 rises toward its high level and reaches its high level. SCLK 214 or SEN 212 remain at their low levels. By time t0 302, VCOMM 252 has already settled to the VCOMM high level. FLT 218 reaches its high level after a delay at least one microsecond to one or more milliseconds. SCLK 214 or SEN 212 activates and reaches its high level, causing the pre boot-up fault monitor to activate. In some implementations, FLT 218 drops to its low level due to internal settling or the like after pre boot-up fault monitor is activated, and returns to its high level after a period 332 of at least one microsecond. In some implementations, a delay period 334 of at least one microsecond begins at time t0 402.

At time t2 306, the delay period 334 ends and the pre-bootup fault monitor 130 or a component thereof determines that a fault condition exists at OUT 262 and communicates the determination to the system processor 104 through FLT 218 by pulling it at a low level. At time t3 408, the pre-bootup sequence ends and SCLK 214 or SEN 212 drops to its low level which ends pre boot-up fault monitoring sequence. In response to determining that a fault condition exists, the system processor prevents, blocks, forgoes, or the like, the bootup sequence and the system remains in a fault condition. In some implementations, the fault condition results in a failsafe mode in which the system cannot further boot-up but the output device 106 is prevented from entering a potential overcurrent state.

Figure 5:
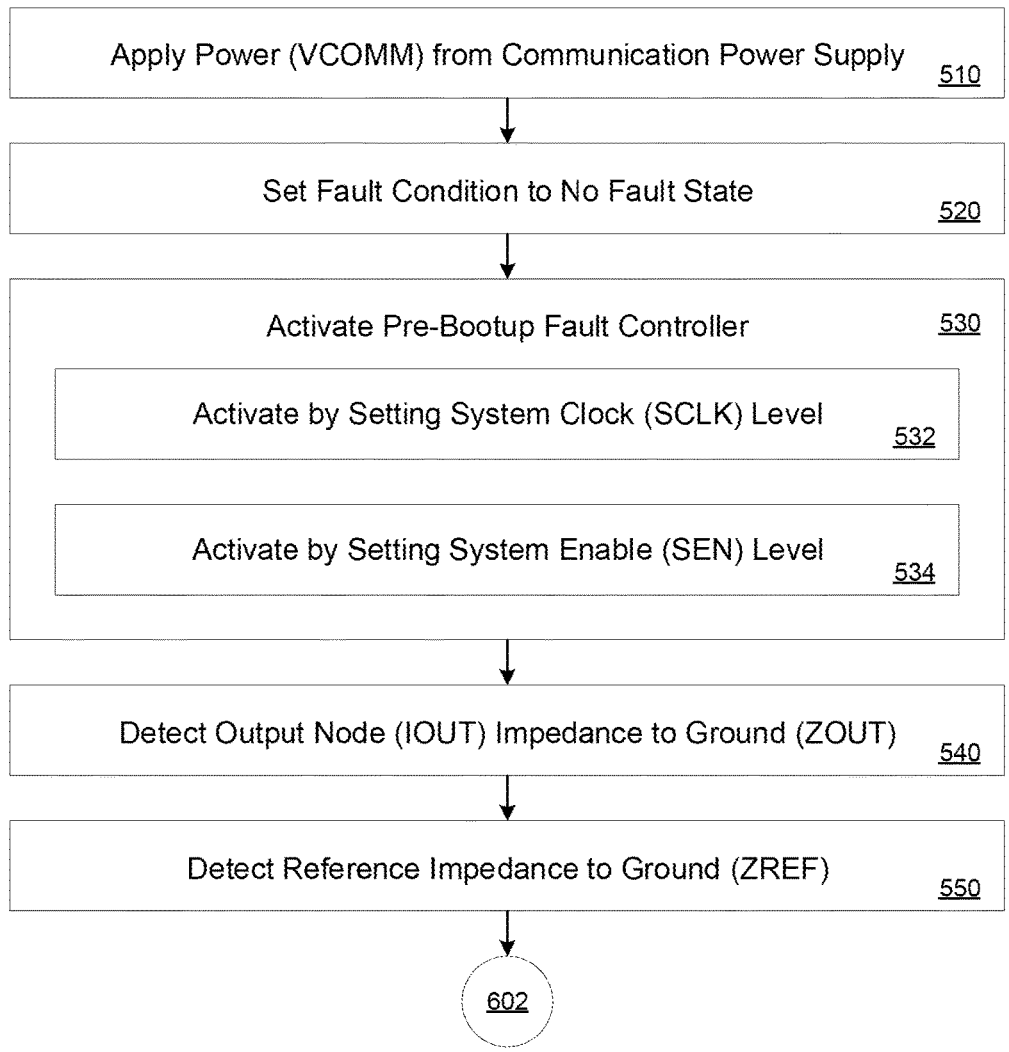
FIG. 5 illustrates an example method of pre-bootup fault control of a driver output, in accordance with present implementations.

FIG. 5 illustrates an example method of pre-bootup fault control of laser output, in accordance with present implementations. In some implementations, at least one of the example system 100 and the example device 200 performs method 500 according to present implementations. In some implementations, the method 500 begins at step 510.

At step 510, the example system applies communication power (VCOMM) from a communication power supply to the pre-bootup fault monitor. In some implementations, the system processor applied the power to the pre-bootup fault monitor. In some implementations, the VCOMM power applied to the pre-bootup fault monitor has a voltage less than at least one of a system power voltage and an output device voltage. The method 500 then continues to step 520.

At step 520, the example system sets a fault condition to a no-fault state. In some implementations, the pre-bootup fault monitor sets the fault condition at a memory, register, or the like thereof or associated therewith. It is to be understood that the example system can forgo setting a fault condition prior to activating the pre-bootup fault monitor, and can set the fault condition in response to one or more subsequent determinations. It is to be further understood that the example system can set the fault condition subsequent to activating the pre-bootup fault monitor. The method 500 then continues to step 530.

At step 530, the example system activates the pre-bootup fault monitor. In some implementations, step 530 includes at least one of steps 532 and 534. In some implementations, At step 532, the example system activates the pre-bootup fault monitor by setting a system clock input (SCLK) level to the pre-bootup fault monitor at a predetermined high or low level. At step 534, the example system activates the pre-bootup fault monitor by setting a system enable (SEN) level to the pre-bootup fault monitor at a predetermined high or low level. The method 500 then continues to step 540.

At step 540, the example system detects an impedance to ground of an output node. In some implementations, the pre-bootup fault monitor detects the impedance of the output node by a common ground operatively coupled to the output node and the pre-bootup fault monitor. In some implementations, the pre-bootup fault monitor detects the impedance by applying VCOMM to the output node and detect a current generated responsive to VCOMM applied to the output node. The method 500 then continues to step 550.

At step 550, the example system detects a reference impedance to ground. In some implementations, the pre-bootup fault monitor detects the reference impedance by applying VCOMM to a first node of reference resistor or the like therein or associated therewith, and detecting a current generated through the reference resistor from the first node to a second node of the reference resistor operatively coupled to ground. The method 500 then continues to step 602.

Figure 6:
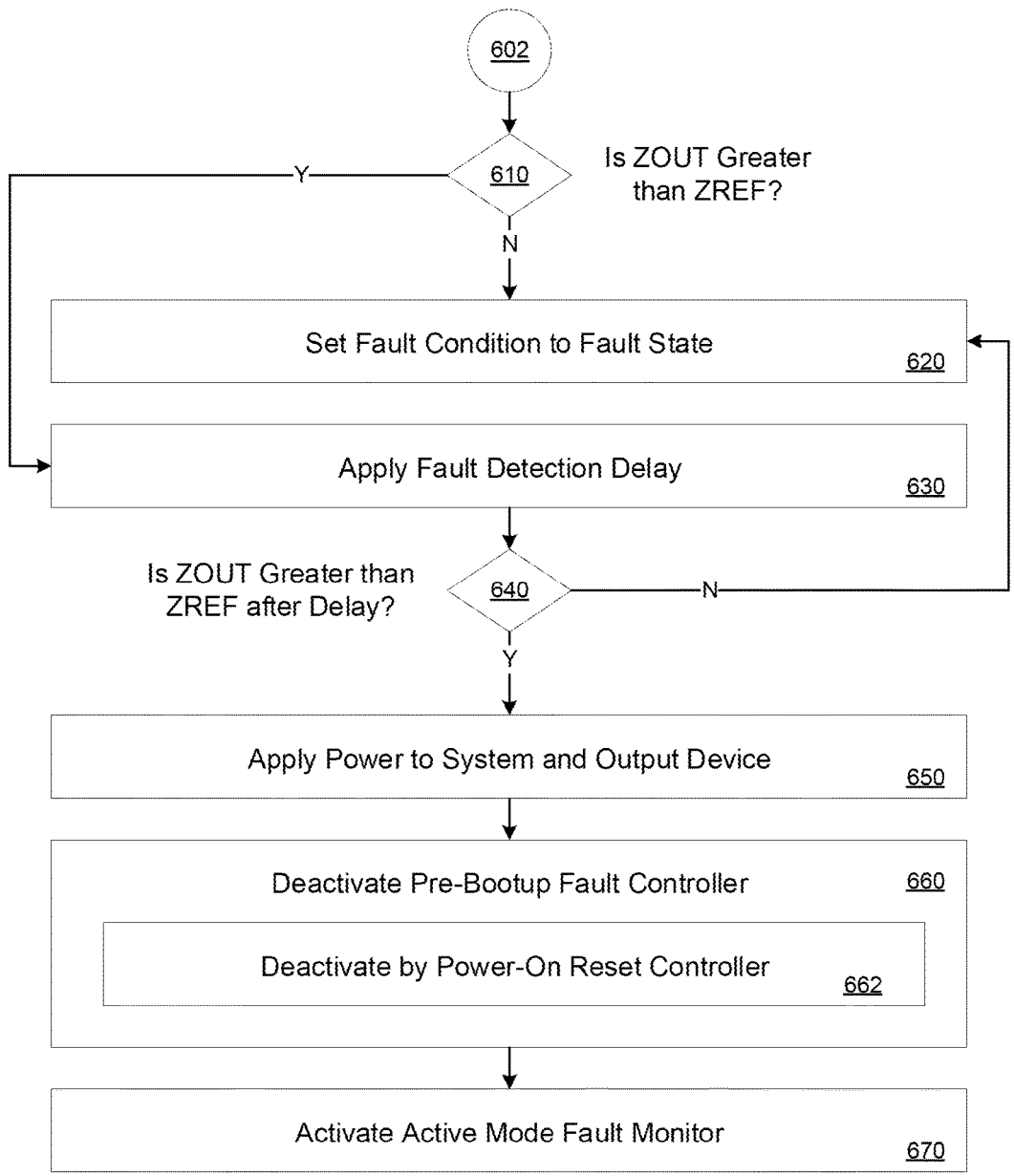
FIG. 6 illustrates an example method of pre-bootup fault monitor of a driver output further to the example method of FIG. 5.

FIG. 6 illustrates an example method of pre-bootup fault control of laser output further to the example method of FIG. 5. In some implementations, at least one of the example systems 100 and the example device 200 performs method 600 according to present implementations. In some implementations, the method 600 begins at step 602. The method 602 then continues to step 610.

At step 610, the example system determines whether the impedance at the output node is greater than the reference impedance at the pre-bootup fault monitor. In some implementations, a comparator determines whether the impedance at the output node satisfies a threshold corresponding to, equal to, or the like, the reference impedance. In some implementations, the determination includes determining whether the impedance at the output node satisfies an impedance threshold corresponding to or equal to the reference impedance. In some implementations, the determination is a determination the impedance at the output node is greater than the reference impedance. In some implementations, the determination is a determination that the impedance at the output node is greater than or equal to the reference impedance. In accordance with a determination that the impedance at the output node is greater than the reference impedance at the pre-bootup fault monitor, the method 600 continues to step 630. Alternatively, in accordance with a determination that the impedance at the output node is less than or equal to, the reference impedance at the pre-bootup fault monitor, the method 600 continues to step 620.

At step 620, the example system set the fault condition to a fault state. In some implementations, the pre-bootup fault monitor sets the fault condition to the fault state. In some implementations, the pre-bootup fault monitor reports the fault state to the system processor by setting the fault node to a high or low voltage level. In response, the system processor can prevent, block, or the like application of high current or high voltage power supply to the output device by preventing a bootup of the output device and any associated electronic devices. In some implementations, the method 600 ends at step 620.

At step 630, the example system applies a fault detection delay. In some implementations, the pre-bootup fault monitor applies a fault detection delay by a delay timer therein or associated therewith. In some implementations, the delay timer is immutably preprogrammed with a delay. In some implementations, the delay corresponds to and is longer than a pre-bootup transitional state in which the fault node is drawn into a fault state during pre-bootup. The method 600 then continues to step 640.

At step 640, the example system determines whether the impedance at the output node is greater than the reference impedance after the delay has elapsed. In some implementations, the pre-bootup fault monitor determines whether the impedance at the output node is greater than the reference impedance after the delay has elapsed. In some implementations, the pre-bootup fault monitor determines whether the impedance at the output node satisfies a threshold corresponding to the reference impedance after the delay. In accordance with a determination that the impedance at the output node is greater than the reference impedance after the delay has elapsed, the method 600 continues to step 650. Alternatively, in accordance with a determination that the impedance at the output node is less than or, in some implementations, equal to the reference impedance after the delay has elapsed, the method 600 continues to step 620.

At step 650, the example system applies power to one or more of the systems and the output device. In some implementations, the system processor applies power to one or more of the systems and the output device. In some implementations, the system processor applies system power to the output device driver, and applies output power to the output device. The method 600 then continues to step 650.

At step 660, the example system deactivates the pre-bootup fault monitor. In some implementations, the system processor deactivates the pre-bootup fault monitor by providing an instruction to apply system power to the output device driver. In some implementations, step 660 includes step 662. At step 662, the example system deactivates the pre-bootup fault monitor by a power-on reset controller. In some implementations, a power-on reset controller is integrated with the output device driver or associated therewith. In some implementations, the power-on reset controller generates a reset signal at a corresponding high or low level and provides the reset signal to the pre-bootup fault monitor. In response, the pre-bootup fault monitor deactivates. The method 600 then continues to step 670.

At step 670, the example system activates an active mode fault monitor. In some implementations, the active mode fault monitor. In some implementations, the method 600 ends at step 670.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Further, unless otherwise noted, the use of the words "approximate," "about," "around," "substantially," etc., mean plus or minus ten percent.

The foregoing description of illustrative implementations has been presented for purposes of illustration and of description. It is not intended to be exhaustive or limiting with respect to the precise form disclosed, and modifications and variations are possible in light of the above teachings or may be acquired from practice of the disclosed implementations. It is intended that the scope of the invention be defined by the claims appended hereto and their equivalents.

What is claimed is:

1. A method of pre-bootup fault control of LASER diode driver output, the method comprising:
    applying a first power to a pre-bootup fault monitor device;
    setting a fault condition at the pre-bootup fault monitor device to a no-fault state;
    initiating the pre-bootup fault monitor device;
    determining whether a first impedance of an output driver, at an output driver node, satisfies an impedance threshold; and
    in response to a determination that the first impedance is less than or equal to the impedance threshold, blocking application of a second power to the output driver node, the output driver node coupled with an output device.

2. The method of claim 1, further comprising:
    detecting the first impedance at an output node operatively coupled to the output device.

3. The method of claim 1, wherein the impedance threshold comprises a second impedance.

4. The method of claim 3, further comprising:
    detecting the second impedance at the pre-bootup fault monitor device.

5. The method of claim 1, wherein the determining whether the first impedance satisfies the impedance threshold comprises determining whether the first impedance is greater than the impedance threshold.

6. The method of claim 1, wherein the determining whether the first impedance satisfies the impedance threshold comprises determining whether the first impedance is greater than or equal to the impedance threshold.

7. The method of claim 1, further comprising:
    in response to the determination that the first impedance satisfies the impedance threshold, deactivating the pre-bootup fault monitor.

8. The method of claim 7, wherein the deactivating the pre-bootup fault monitor further comprises deactivating the pre-bootup fault monitor by a power-on reset controller.

9. The method of claim 1, further comprising:
    in response to the determination that the first impedance satisfies the impedance threshold, activating an active mode fault monitor.

10. The method of claim 1, wherein the determination that the first impedance satisfies the impedance threshold further comprises a determination that the first impedance satisfies the impedance threshold after a predetermined delay.

11. The method of claim 1, further comprising:
    in response to a determination that the first impedance does not satisfy the impedance threshold, setting the fault condition to a fault state.

12. A device comprising:
    a pre-bootup fault monitor device operatively coupled with a laser output device, and operable to activate in response to receiving a first power, set a fault condition to a no-fault state, determine whether a first impedance of a laser output device, at an output driver node, satisfies an impedance threshold, and, in response to a determination that the first impedance is less than or equal to the impedance threshold, block application of a second power to the output driver node, the output driver node coupled with the laser output device.

13. The device of claim 12, wherein the pre-bootup fault monitor device is further operable to detect the first impedance to ground at an output node operatively coupled to the output device.

14. The device of claim 12, wherein the impedance threshold comprises a second impedance.

15. The device of claim 14, wherein the pre-bootup fault monitor device is further operable to detect the second impedance by an internal reference impedance to ground.

16. The device of claim 12, further comprising:
    a system processor operatively coupled to the pre-bootup fault monitor and operable to, in response to the determination that the first impedance satisfies the impedance threshold, deactivate the pre-bootup fault monitor.

17. The device of claim 16, wherein the system processor is further operable to, in response the determination that the first impedance satisfies the impedance threshold, activate an active mode fault monitor.

18. The device of claim 12, further comprising:
a power-on reset controller operatively coupled with a system processor and the pre-bootup fault monitor, and operable to deactivate the pre-bootup fault monitor.

19. The device of claim 18, wherein the power-on reset controller is further operable to determine that the first impedance satisfies the impedance threshold after a predetermined delay.

20. A system comprising:
a laser output device;
a pre-bootup fault monitor device operatively coupled with the laser output device, and operable to activate in response to receiving a first power, set a fault condition to a no-fault state, determine whether a first impedance of an output driver, at an output driver node, satisfies an impedance threshold, and, in response to a determination that the first impedance is less than or equal to the impedance threshold, block application of a second power to the output driver node, the output driver node coupled with the laser output device; and
a power-on reset controller operatively coupled to the pre-bootup fault monitor and operable to, in response to the determination that the first impedance satisfies the impedance threshold, deactivate the pre-bootup fault monitor.

* * * * *